United States Patent
Iwata

[19]

[11] Patent Number: 6,139,682
[45] Date of Patent: Oct. 31, 2000

[54] PROCESSING APPARATUS FOR MANUFACTURING SEMICONDUCTORS

[75] Inventor: Seiya Iwata, Kumamoto, Japan

[73] Assignee: NEC Corporation, Tokyo, Japan

[21] Appl. No.: 09/288,496

[22] Filed: Apr. 8, 1999

[30] Foreign Application Priority Data

Apr. 9, 1998 [JP] Japan .................................. 10-097854

[51] Int. Cl.$^7$ .............................. C23F 1/02; C23C 16/00; B05C 13/00; B25B 11/00; B25B 13/00

[52] U.S. Cl. .......................... 156/345; 118/500; 118/728; 204/298.15; 269/21

[58] Field of Search .................................. 118/728, 729, 118/500; 156/345; 204/298.15; 269/21

[56] References Cited

U.S. PATENT DOCUMENTS

| | | | |
|---|---|---|---|
| 3,711,081 | 1/1973 | Cachon | 269/21 |
| 4,183,545 | 1/1980 | Daly | 279/3 |
| 4,265,476 | 5/1981 | Elgart | 294/64 R |
| 5,035,409 | 7/1991 | Mulliner | 269/21 |
| 5,374,829 | 12/1994 | Sakamoto et al. | 250/453.11 |
| 5,407,519 | 4/1995 | Joffe et al. | 156/358 |
| 5,449,410 | 9/1995 | Chang et al. | 118/723 ER |
| 5,516,367 | 5/1996 | Lei et al. | 117/725 |
| 5,534,073 | 7/1996 | Kinoshita et al. | 118/728 |
| 5,766,365 | 6/1998 | Umotoy et al. | 118/728 |
| 5,855,679 | 1/1999 | Ogawa | 118/719 |
| 6,059,985 | 5/2000 | Yoshimura et al. | 216/37 |

FOREIGN PATENT DOCUMENTS

| | | | |
|---|---|---|---|
| 55-4932 | 1/1980 | Japan | H01L 21/68 |
| 8-124901 | 5/1996 | Japan | H01L 21/3065 |
| 8-330387 | 12/1996 | Japan | H01L 21/68 |
| 9-129713 | 5/1997 | Japan | H01L 21/68 |

OTHER PUBLICATIONS

Japanese Office Action dated Feb. 16, 1999, with partial translation.

*Primary Examiner*—Felisa Hiteshew
*Assistant Examiner*—Matthew Anderson
*Attorney, Agent, or Firm*—McGinn & Gibb, P.C.

[57] ABSTRACT

A processing apparatus comprises a support for supporting a body to be processed within a processing chamber. The support is equipped with a lift for lifting said body and lowering the body. The lift includes a plurality of rods disposed in a plurality of cylinders formed through the support, respectively. Each of the plurality of rods has a piston for movement in one of the plurality of cylinders to produce reduced pressure in a space within the cylinder between the piston and the body resting on the support. An actuator is drivingly coupled with the plurality of rods to lower the rods against suction created due to reduced pressure in the spaces.

5 Claims, 2 Drawing Sheets

PROCESSING APPARATUS FOR MANUFACTURING SEMICONDUCTORS

FIELD OF THE INVENTION

The present invention relates to a processing apparatus for manufacturing semiconductors, and more particularly to a CVD (Chemical Vapor Deposition) processing apparatus for processing a body, such as a wafer.

BACKGROUND OF THE INVENTION

Among CVD processing apparatuses, a plasma processing apparatus is known from U.S. Pat. No. 5,449,410 (issued Sep. 12, 1995, Chang, et al.). Such plasma processing apparatus, in general, comprises a processing chamber having therein a susceptor for supporting a body to be processed, and a pair of spaced electrodes. The susceptor is one of the electrodes. The other electrode is a showerhead through which various gases are admitted into the chamber to generate plasma in the chamber. The particular process achieved in the apparatus depends on the gas or gases used. Some gases results in an etching of the body on the susceptor, and other gases react to deposit a layer on the body.

During performing a processing step in the chamber, it is desired to fixedly hold the body to the susceptor. This is needed to deposit a uniform layer on the body.

SUMMARY OF THE INVENTION

For fixedly holding the body on the susceptor, a pump may be provided to create reduced pressure in a region below the body, producing suction for holding the body to the susceptor. The provision of such pump is disadvantageous in a current movement to a compact and less expensive processing apparatus.

Accordingly an object of the present invention is to provide a processing apparatus which does not require a pump for holding a body to be processed to a susceptor portion of a support.

According to one aspect of the present invention, there is provided a processing apparatus comprising:

a processing chamber;

a body to be processed;

a support having a surface adapted for supporting said body at a surface level within said processing chamber, said surface being formed with a plurality of openings within an area to be covered by said body when said body rests on said surface, said support including a plurality of cylinders, each communicating at one end with one of said plurality of openings; and a lift for lifting said body to a level higher than said surface level and lowering said body to said surface level to allow said body to rest thereon, said lift including a plurality of rods disposed in said plurality of cylinders, respectively, and connected in common for unitary motion within said plurality of cylinders, said plurality of rods having one ends for abutting engagement with said body, each of said plurality of rods having a piston for movement in one of said plurality of cylinders to produce reduced pressure in a space within the cylinder between said piston and said body resting on said surface to cover said plurality of openings, said lift including an actuator drivingly coupled with said plurality of rods to lower said plurality of rods below said surface level against suction created due to reduced pressure in said spaces.

DESCRIPTION OF THE PREFERRED EMBODIMENTS

Figure 1:
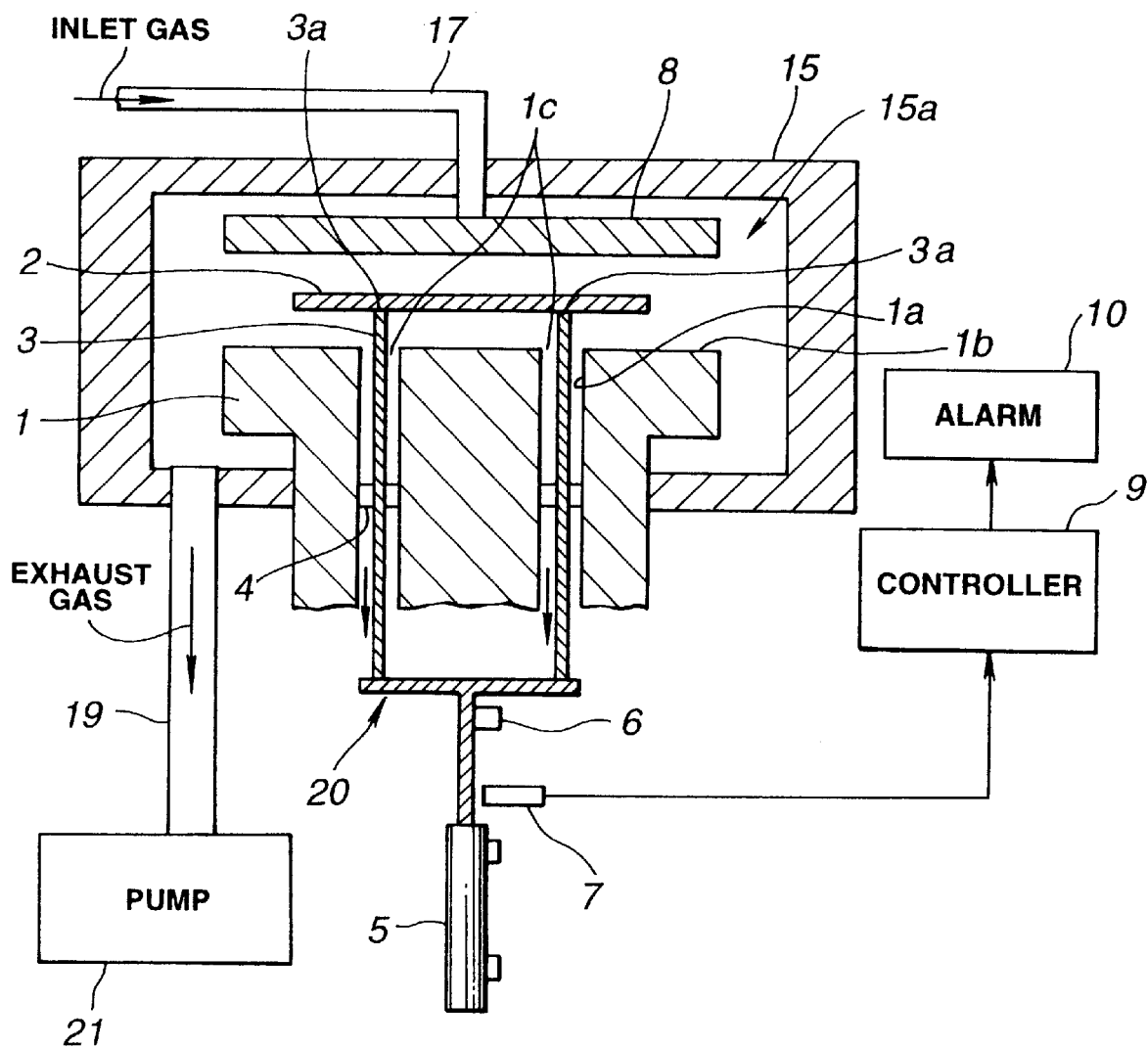
FIG. 1 is a generalized block diagram of the preferred implementation of a processing apparatus according to the present invention, showing a position in which a body to be processed is lifted from a susceptor portion of a support.
Figure 2:
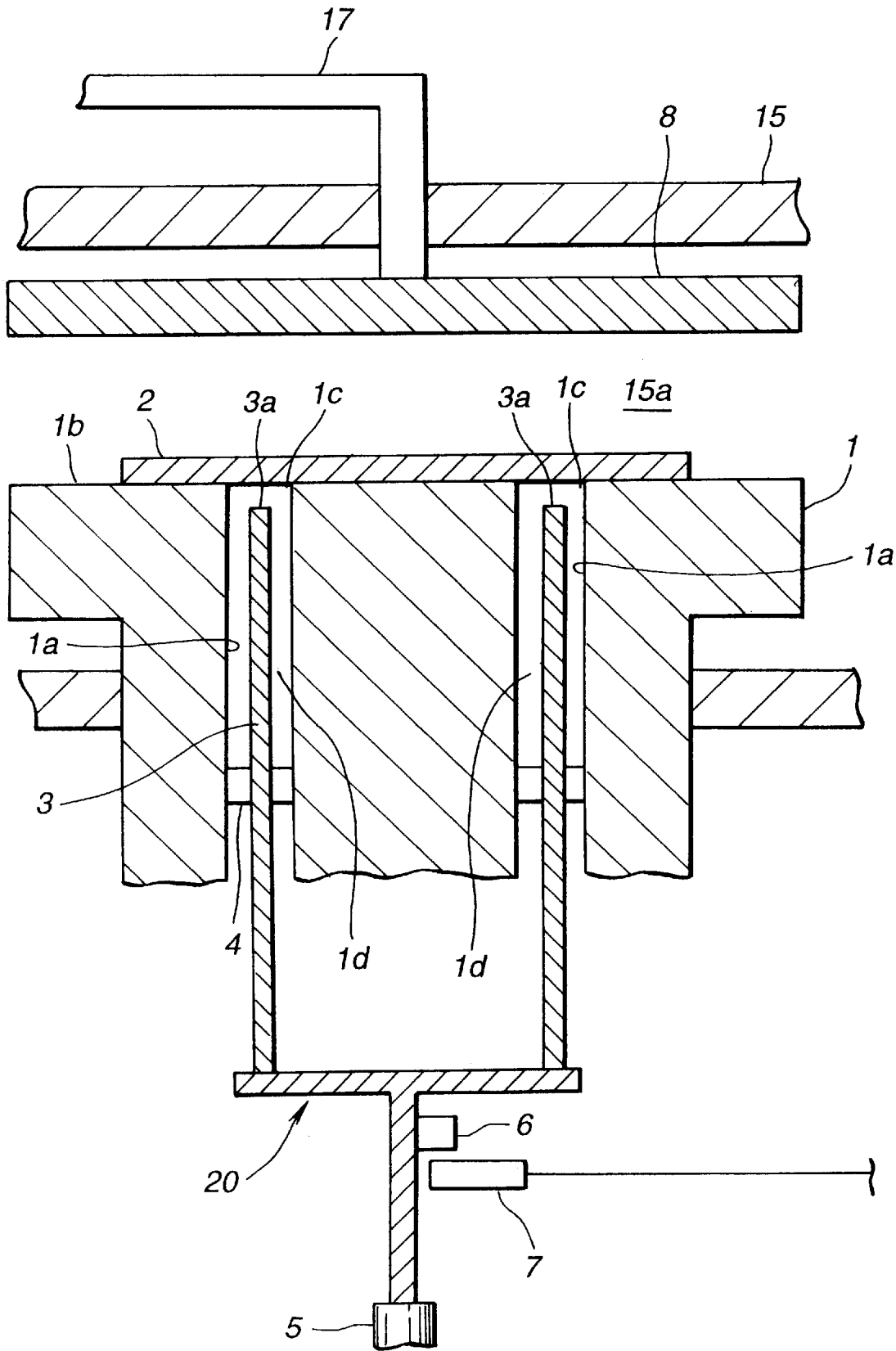
FIG. 2 is an enlarged view of a portion of FIG. 1, showing a position in which the body rests at an appropriate position on the susceptor.

Referring now to FIGS. 1 and 2, FIG. 1 is a schematic sectional view of a CVD processing apparatus, and FIG. 2 is an enlarged view of a portion of the apparatus. The processing apparatus comprises walls 15 defining a processing chamber 15a. The walls 15 includes a top wall, an open bottom wall and peripheral walls.

A showerhead 8 is mounted to the top wall and has a plurality of small openings (not shown) to allow a gas to flow from the showerhead 8 into the chamber 15a. A gas inlet pipe 17 extends to the top wall to supply gas to the showerhead 8.

A support 1 includes a susceptor portion formed with a flat surface 1b adapted for supporting a body 2 to be processed at a surface level within the chamber 15a. The body 2 is in the form of a wafer in this embodiment. The support 1 also includes a shaft portion extending vertically, viewing in FIG. 1, through the opening of the bottom wall in seal tight manner. The surface 1b of the susceptor portion extends parallel to the showerhead 8.

For evacuating any gas introduced into the chamber 15a, an outlet pipe 19 and a pump 21 are provided. During operation of the processing apparatus, pressure within the processing chamber 15a is kept at a predetermined level.

The surface 1b of the susceptor portion is formed with a plurality of openings 1c. These openings 1c are disposed within an area, which is to be covered by the body 2 when the body 2 rests on the surface 1b of the susceptor portion as shown in FIG. 2.

The support 1 includes a plurality of cylinders 1a. These cylinders 1a extend through the shaft and susceptor portions of the support 1 and communicate at one end with the plurality of openings 1c, respectively.

The processing apparatus is equipped with a lift 20 for receiving body 2 that is introduced into the processing chamber 15a. U.S. Pat. No. 5,855,679 issued Jan. 5, 1999 to Ogawa discloses a semiconductor manufacturing apparatus including a transport robot for introducing a body to be processed into a processing chamber of a CVD processing apparatus. This U.S. Patent, Ogawa, has been assigned to the assignee of the present application and claims priority based on Japanese Patent Application Serial No. 7-072932, which was laid open for publication inspection in Japan on Dec. 13, 1996 under JP-A 8-330387.

The lift 20 can lift the body 2 to a level (see FIG. 1) higher than the surface level (see FIG. 2) and lower it to the surface level to all it to rest on the surface 1b. At the higher level, the lift 20 receives body 2 that has been introduced into the processing chamber 15a.

The lift 20 includes a plurality of rods 3 disposed in the cylinders 1a, respectively. The rods 3 are connected in common for unitary motion within the cylinders 1a. The rods 3 have one or top ends 3a for abutting engagement with the body 2.

The processing apparatus can produce reduced pressure below a lower side of the body 2 to create suction to fixedly hold the body 2 onto the flat surface 1b of the susceptor portion of the support 1. Each of the rods 3 has a piston 4, preferably in the form of a seal, for movement in the associated one of the plurality of cylinders 1a. Each of the pistons 4 define, within the associated one cylinder 1a, a variable volume space 1d (see FIG. 2) between the piston 4 and the body 2 that rests on the surface 1b of the susceptor portion of the support 1. During operation of the processing apparatus, lowering the rods 3 further below the surface level after the body 2 has rested on the surface 1b to close the openings 1c toward the position as illustrated in FIG. 2 produces reduced pressure in the spaces 1d below the body 2.

The lift 20 includes an actuator 5, preferably in the form of a fluid cylinder. The actuator 5 is drivingly coupled with the rods 3 for lifting them to the level higher than the surface level as shown in FIG. 1 and for lowering them to the level below the surface level as shown in FIG. 2. The setting is such that force imparted by the actuator 5 to the rods 3 to lower them balances with suction produced in the spaces 1d in the position of the parts as illustrated in FIG. 2. This balanced position is broken if the magnitude of suction is not sufficiently high, allowing further downward movement of the rods 3 beyond the position of FIG. 2. The magnitude of suction produced in the spaces 1d does not increase sufficiently if the body 2 fails to rest on the appropriate position of the surface 1b of the susceptor portion of the support 1, with some of the openings 1c left uncovered.

During operation, the processing apparatus can notify an operator when body 2 fails to rest on the appropriate position of the surface 1b of the susceptor portion of the support 1. A position transducer includes a plate 6 attached the assembly of the rods 3 for movement therewith and a set of light beam emitter and receiver 7. A light beam from the light beam emitter to the receiver is in the path of the plate 6 when the rods 3 are lowered below the surface level beyond a predetermined magnitude of displacement. Interruption of the light beam by the plate 6 causes the position transducer to produce a signal. The setting is such that, downward movement of the rods 3 beyond the position as illustrated in FIG. 2 causes the position transducer (6, 7) to produce the signal. This signal is fed to a controller 9. The controller 9 includes software. According to this software, motion of the actuator 5 is immediately stopped to prevent further downward motion of the rods 3 upon production of the signal by the position transducer (6, 7) and an alarm or monitor 10 is activated to notify the operator.

The above-described implementation of the present invention is an example implementation. Moreover various modifications to the present invention may occur to those skilled in the art and will fall within the scope of the present invention as set forth below.

What is claimed is:

1. A processing apparatus comprising:
    a processing chamber;
    a body to be processed;
    a support having a surface adapted for supporting said body at a surface level within said processing chamber,
    said surface being formed with a plurality of openings within an area to be covered by said body when said body rests on said surface,
    said support including a plurality of cylinders, each communicating at one end with one of said plurality of openings; and
    a lift for lifting said body to a level higher than said surface level and lowering said body to said surface level to allow said body to rest thereon,
    said lift including a plurality of rods disposed in said plurality of cylinders, respectively, and connected in common for unitary motion within said plurality of cylinders,
    said plurality of rods having one ends for abutting engagement with said body,
    each of said plurality of rods having a piston for movement in one of said plurality of cylinders to produce reduced pressure in a space within the cylinder between said piston and said body resting on said surface to cover said plurality of openings,
    said lift including an actuator drivingly coupled with said plurality of rods to lower said plurality of rods below said surface level against suction created due to reduced pressure in said spaces.

2. The processing apparatus as claimed in claim 1, further comprising: a transducer for producing a signal when said rods have lowered below said surface beyond a magnitude.

3. The processing apparatus as claimed in claim 2, further comprising:
    a controller receiving said signal from said position transducer and stopping motion of said actuator upon production of said signal.

4. The processing apparatus as claimed in claim 3, further comprising:
    an alarm being activated by said controller upon production of said signal.

5. A processing apparatus, comprising:
    a processing chamber;
    a body to be processed;
    a support adapted for supporting said body within said processing chamber,
    said support including a plurality of cylinders, each communicating at one end with said processing chamber; and
    a lift for lifting said body and lowering said body to allow said body to rest on said support,
    said lift including a plurality of rods disposed in said plurality of cylinders, respectively, and connected in common for unitary motion within said plurality of cylinders,
    said plurality of rods having one ends for abutting engagement with said body,
    each of said plurality of rods having a seal for movement in one of said plurality of cylinders to produce reduced pressure in a space within the cylinder between said seal and said body resting on said support,
    said lift including an actuator drivingly coupled with said plurality of rods to lower said plurality of rods against suction created due to reduced pressure in said spaces.

* * * * *